United States Patent [19]
Clark, Jr. et al.

[11] Patent Number: 5,047,827
[45] Date of Patent: Sep. 10, 1991

[54] INTEGRATED CIRCUIT RESISTOR FABRICATION USING FOCUSED ION BEAM

[75] Inventors: William M. Clark, Jr., Thousand Oaks; Gary M. Atkinson, Santa Monica; Wing Y. Lum, San Diego; James R. Herring, San Marcos, all of Calif.

[73] Assignee: Hughes Aircraft Company, Los Angeles, Calif.

[21] Appl. No.: 569,690

[22] Filed: Aug. 20, 1990

[51] Int. Cl.⁵ .................. H01L 27/02; H01L 27/10; H01C 3/10; H01C 7/22
[52] U.S. Cl. ........................ 357/51; 357/45; 357/91; 338/283; 338/295
[58] Field of Search ............ 357/51, 91, 45, 63; 338/283, 295

[56] References Cited

U.S. PATENT DOCUMENTS 3,906,430  9/1975  Hareyama et al. ............... 338/295
4,725,876  2/1988  Kishi .............................. 357/51

OTHER PUBLICATIONS

"Basic Integrated Circuit Engineering", Hamilton and Howard, McGraw Hill, 1975, pp. 16-21.
"Polysilicon for Integrated Circuit Applications", by T. Kamins, Klower Academic Publishers, 1988, pp. 212-215.

*Primary Examiner*—Mark Prenty
*Attorney, Agent, or Firm*—Paul M. Coble; W. K. Denson-Low

[57] ABSTRACT

A high value, precision resistor (10) includes a doped region (18) having a boustrophedonic (folded or meandering) shape formed in a substrate (12). At least one section of the doped region (18) is formed by implantation using a focused ion beam. Where the entire doped region (18) is formed by the focused ion beam, the length thereof is selected to be large (10 to 100 times the width of the boustrophedonic shape) to maximize the accuracy of the resistor (10) by averaging over variations in grain size and implant dose. Alternatively, a probe resistor (32) and a plurality of similar unconnected doped sections (28) may be formed by means such as photolithography and flood ion implantation. The probe resistor (32) is measured at the desired operating temperature to determine the ratio of the measured resistance to the desired design resistance value. The unconnected doped sections (28) are then interconnected by plugs (40, 42, 44, 46), formed with a focussed ion beam, to program the fabricated resistor to exactly the designed resistance value at the desired operating temperature.

20 Claims, 2 Drawing Sheets

INTEGRATED CIRCUIT RESISTOR FABRICATION USING FOCUSED ION BEAM

BACKGROUND OF THE INVENTION

1. Field of the Invention

The present invention relates to the fabrication of high value, high precision integrated circuit resistors using a focused ion beam.

2. Description of the Related Art

Integrated circuit resistors are conventionally formed by diffusion of dopant materials as described in a textbook entitled "Basic Integrated Circuit Engineering", by Hamilton and Howard, McGraw Hill, 1975, pp. 16-21, and by deposition or implantation of lightly doped polysilicon as described in a textbook entitled "Polysilicon for Integrated Circuit Applications", by T. Kamins, Klower Academic Publishers, 1988, pp. 212-215. The former reference teaches how conventional diffused resistors may be formed in a maze geometry to conserve space on the chip.

The drawback of both of these methods of integrated circuit resistor fabrication is low accuracy or precision. The values of resistors fabricated by either method may vary by as much as 20% to 100%. The resistance of polysilicon resistors also varies rapidly in response to changes in temperature. These limitations are intolerable in applications such as current dividing resistors for focal plane arrays which must have extremely precise resistance values at a given operating temperature.

A known technique for adjusting the value of an integrated circuit resistor after it has been formed is to ablate away a section thereof using a laser beam. However, the accuracy of this expedient is limited by the relatively large diameter (on the order of one micrometer or more) of conventional laser beams, and its usefulness is limited in that the value of the resistor can only be increased by ablation.

SUMMARY OF THE INVENTION

The present invention enables the fabrication of high precision (less than 5% tolerance over a chip) integrated circuit resistors having large resistance values ($10^6$ to $10^9$ ohms).

In one embodiment of the invention, a focused ion beam (FIB) is used to implant an appropriate dopant ion or ions along a path in a substrate or chip in which the FIB dose, energy, and the implanted area can be chosen and maintained accurately to achieve the proper resistance. The implanted region has a boustrophedonic shape (a folded or meander path) to minimize the area required for the resistor on the chip.

In another embodiment of the invention, a matrix of parallel, unconnected doped sections is formed in a substrate between heavily doped ohmic contacts using conventional diffusion or implantation techniques. The sheet resistance of the unconnected sections is measured at a desired operating temperature, and the matrix is "programmed" to interconnect the unconnected sections and ohmic contacts in accordance with the measured sheet resistance so as to produce a resistor having the required value of resistance. The interconnection is implemented by means of plugs formed with a FIB, or other applicable method.

More specifically, a high value, precision resistor includes a doped region having a boustrophedonic shape formed in a substrate. At least one section of the doped region is formed by implantation using a FIB. Where the entire doped region is formed by the FIB, the length thereof is selected to be large (10 to 100 times the width of the boustrophedonic shape) to maximize the accuracy of the resistor by averaging over variations in grain size and implant dose. Alternatively, a plurality of unconnected doped sections may be formed by means such as diffusion, and interconnected by plugs formed with a FIB in accordance with the measured sheet resistance of the unconnected sections at a desired operating temperature. A programmed number of the unconnected sections may be interconnected in series where the measured sheet resistance is lower than a reference value, and in parallel where the measured sheet resistance is higher than the reference value. Where the ratio of the measured sheet resistance to the reference value has a non-integer value, two of the unconnected sections may be interconnected at intermediate positions thereof in accordance with the non-integer part of the ratio.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
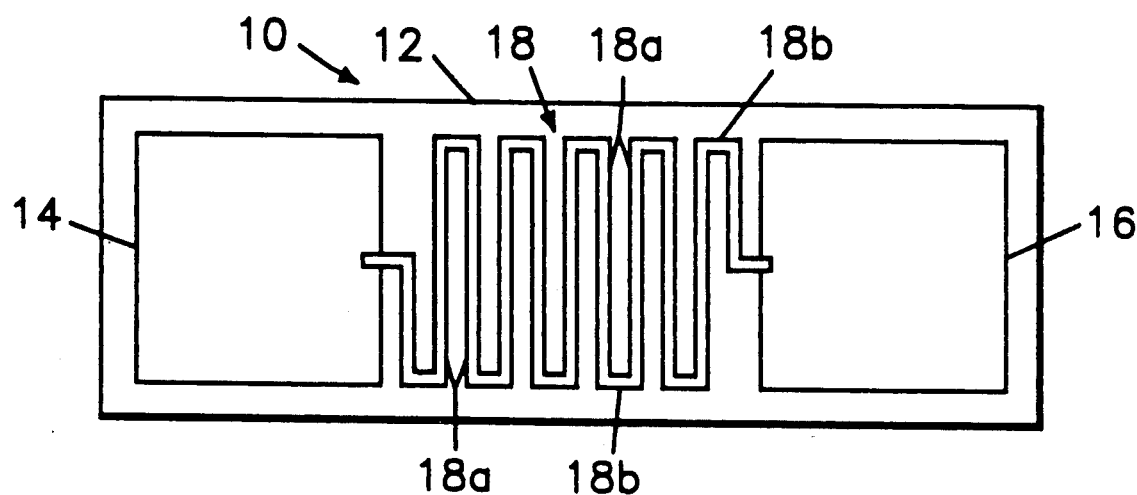
FIG. 1 is a diagram illustrating an integrated circuit resistor fabricated in accordance with the present invention, including a high resistance doped region which is formed entirely using a focused ion beam.

Referring now to FIG. 1 of the drawing, a first embodiment of an integrated circuit resistor fabricated in accordance with the present invention is generally designated as 10, and includes a substrate 12. Although a preferred material for the substrate 12 is monocrystalline or polycrystalline silicon, the invention is not so limited, and the invention may be practiced using a substrate formed of, for example, gallium arsenide.

The resistor 10 may include two optional ohmic contacts 14 and 16 for interconnection with other elements (not shown) formed in or on the substrate 12. The contacts 14 and 16 may be formed of metal, or constituted by highly doped regions formed in the substrate 12 having low electrical resistance and a typical dopant concentration on the order of $10^{19}$ to $10^{20}$ ions/cm$^3$.

The resistor 10 further includes a doped region 18 formed in the substrate 12 by implantation using a focused ion beam (FIB). The doped region 18 has a boustrophedonic (folded, serpentine, or meandering) shape, including a plurality of parallel legs 18a interconnected at their ends as illustrated in the drawing by connecting sections 18b, and has a lower sheet resistance than the substrate 12. The doped region 18 constitutes the portion of the resistor 10 which actually provides the electrical resistance, whereas the substrate 12 constitutes a host material.

The present resistor 10 differs from conventional integrated circuit resistors formed by diffusion, deposition, or implantation in polysilicon in that the resistance value can be controlled within much closer tolerances than is possible in the prior art. This is because the FIB ion species, energy, dose, and area of the FIB implant can be maintained with extreme accuracy. The boustrophedonic path and extremely high spatial resolution of the FIB (on the order of 0.1 micrometers) enables the resistor 10 to be fabricated in a much smaller space on the substrate 12 than is possible using conventional techniques.

The doped region 18 is preferably made as long as possible within the particular design constraints, in order to maximize the fabrication precision or accuracy, and thereby minimize the tolerance in the value of the resistor 10. This is because the longer path length averages over variations in the grain size (where the substrate 12 is polysilicon), and implant dose. In a practical application of the invention, it is preferred that the length of the doped region 18 be between approximately 10 and 100 times the spacing between the adjacent edges of the contacts 12 and 14.

It will be noted for purposes of the present disclosure that the term "substrate" refers to the host material in which the doped region 18 is formed. Where the doped region 18 is formed in a layer of polysilicon which is in turn formed on a wafer of bulk silicon, for example, the polysilicon layer is considered to be the substrate rather than the bulk silicon wafer.

Numerous combinations of materials and parameters are included within the scope of the invention. The substrate 12 may be undoped, or doped with either P or N ions depending on the particular application. The substrate may also be formed of lightly doped polysilicon, which typically has a dopant concentration on the order of $10^{15}$ ions/cm$^3$. The doped region 18 may be doped with P or N ions, either singly or in any desired combination, with the dose, energy, area, and depth selected in accordance with the particular application. The number, length, and spacing of the legs 18a of the doped region 18 are also selected in accordance with the particular application. Although the legs 18a are illustrated as being formed in a generally rectangular configuration, the invention is not so limited, and the doped region 18 may have a curved, spiral, or any other shape as desired.

The resistance R of the doped region 18 is given as $R = R_{sq} \times (L/W)$, where $R_{sq}$ is the sheet resistance in ohms/square, L is the length of the doped region 18, and W is the width of the legs 18a and connecting sections 18b. As a typical example of a resistor 10 formed in accordance with the present invention, the doped region 18 may be formed by implantation of arsenic ions (an N type dopant) using a FIB with a dose of 5 to $10 \times 10^{13}$ ions/cm$^2$ at an energy on the order of 120 KEV. The sheet resistance $R_{sq}$ is on the order of 5000 ohms/square. For a length L=300 micrometers and a width W=1.5 micrometers, the resistance value of the resistor 10 will be $10^6$ ohms. Such a resistor 10 may typically be formed as including ten legs 18a (9 complete legs and 2 half legs) as illustrated in FIG. 1, with the length of each leg 18a being approximately 30 micrometers, and the spacing between the legs 18a being approximately 1 to 2 micrometers.

The doped region 18 may alternatively be formed using boron ions (a P type dopant) with a dose similar to that for arsenic as described above, at an energy on the order of 40 KEV. The dopant ion species suitable for practicing the invention are not limited to arsenic or boron, but may include phosphorous, gallium, silicon, beryllium, etc. Although direct implantation using a FIB is the preferred method of practicing the invention since it can be performed in a single step with precisely controlled parameters, it is possible to perform the method of the invention using alternative means, such as using electron beam lithography to define the path of the doped region 18 in a photoresist layer (not shown), and then performing a flood ion beam implant.

Figure 2:
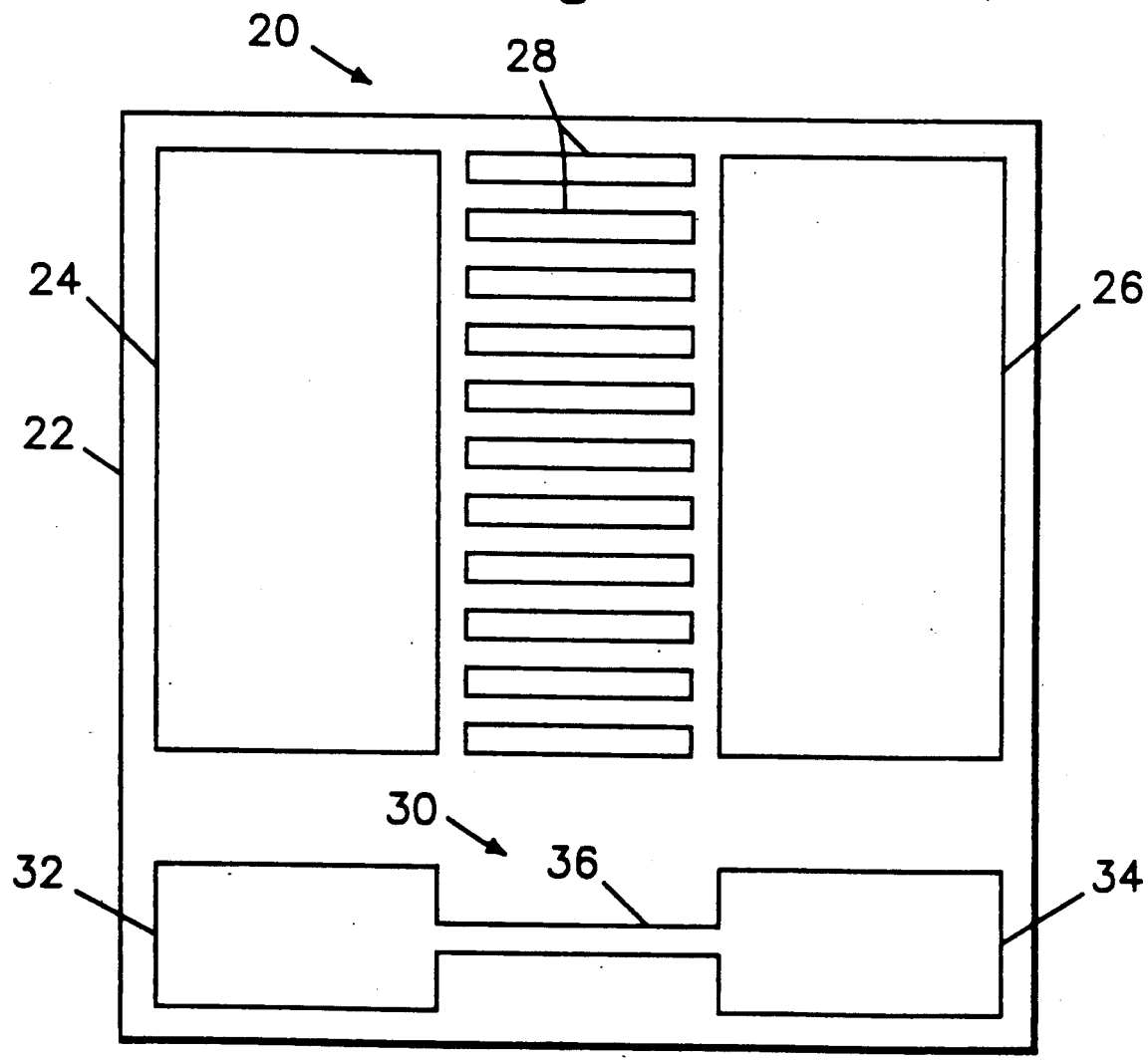
FIG. 2 is a diagram illustrating a programmable resistor matrix and an associated probe resistor formed in accordance with the present invention.

Although the first embodiment of the invention in which the entire doped region is formed by a FIB produces integrated circuit resistors of extremely high precision, the time required for FIB implantation may be too long for some applications. FIG. 2 illustrates a second embodiment of the present invention which is advantageous in that it can produce the required FIB implants in a greatly reduced length of time utilizing a "programmable matrix resistor" configuration. A programmable base matrix 20 includes a substrate 22 formed of a suitable material such as lightly doped polysilicon as described above. First and second ohmic contacts 24 and 26 are formed in or on the substrate 22. A plurality of unconnected doped sections 28 are formed in the substrate 22 by a conventional process such as diffusion or implantation utilizing photolithography, or any other suitable means other than implantation using a FIB. The dopant species, concentration, etc. may be selected in accordance with a particular application as discussed above with reference to FIG. 1.

The left ends of the doped sections 28 are adjacent to the first contact 24, whereas the right ends of the doped sections 28 are adjacent to the second contact 26 as viewed in FIG. 2. Since the sections 28 are formed by a conventional method with much less accuracy than FIB implantation, the sheet resistance of the sections 28 will generally differ from a desired design value by a relatively large margin. The present invention uses the matrix 20 to produce an integrated circuit resistor having a very precise resistance value at a desired operating temperature by employing conventional techniques which are capable of fabricating many base matrices 20 on a wafer simultaneously at low cost, and utilizing a FIB exclusively to "program" each matrix 20 by interconnecting the sections 28 and contacts 14 and 16 in such a manner as to provide the precise, desired value of resistance.

The base matrix 20 may further include a probe or test resistor 30, including ohmic contacts 32 and 34 constituted by highly doped regions or the like, and a doped region 36 which is electrically connected to the contacts 32 and 34 at its opposite respective ends. The doped region 36 is preferably formed simultaneously and integrally with the doped sections 28, so as to have identical characteristics.

The particular base matrix design illustrated in FIG. 2 permits programming of a resistor value over approximately two orders of magnitude, thereby enabling the resistor value to be varied in a ten-fold amount in either direction between the actual sheet resistance of the sections 28 and a desired design or reference value. However, the invention is not limited to this particular configuration, and the number and shape of the sections, relative dimensions, etc. thereof may be varied to suit a particular application.

The exemplary embodiment illustrated in FIG. 2 includes eleven unconnected doped sections 28, each having a length of 8w and a width of w (where w is a selected unit width). The vertical spacing between adjacent sections 28 is w, and the distance between the ends of the sections 28 and the adjacent edges of the contacts 24 and 26 is also w. The length of the doped region 36 of the test or probe resistor 30 is 10w.

The geometry of the matrix design determines the range over which the resistor may be programmed, as well as the accuracy of the programmed resistance value. In general, increasing the number of horizontal sections 28 provides more programming range, whereas longer sections 28 provide more accuracy in programming. There is a trade-off in practical application in that larger range and higher accuracy require more area on a chip. The optimal programmable resistor matrix design is therefore a compromise between range, accuracy, and available area.

The sheet resistance of the sections 28 may vary over a considerable range (assumed to be less than 100% in either direction) from the design value due to uncontrollable variations in fabrication parameters, and temperature. The concept of the embodiment of FIG. 2 is to determine the actual sheet resistance of the sections 28 by measurement at the desired operating temperature, and interconnect the sections 28 using a FIB in accordance with the measured sheet resistance to obtain a resistor with the desired resistance value at the desired operating temperature within a small range of tolerance. Where the actual and design values of sheet resistance are equal, the desired resistor will be simply constituted by one section 28 connected at its opposite ends by plugs having the same sheet resistance as the sections 28 to the contacts 24 and 26 respectively.

Where the actual sheet resistance is lower than the design value, at least part of one section 28 is connected in series with at least one other entire section 28 to increase the resistance to the desired value. A maximum of ten of the sections 28 will be interconnected in series in this particular design, giving a total resistance of approximately ten times the resistance of one section 28. Conversely, where the actual sheet resistance is higher than the design value, at least part of one section 28 is connected in parallel with at least one other entire section 28 to decrease the resistance to the desired value. If all ten of the sections 28 in this design are interconnected in parallel, the total resistance will be approximately one-tenth the resistance of one section 28.

Assuming that $R_m$ is the measured resistance of the doped region 36 of the probe resistor 30, measured by connecting a suitable resistance measuring instrument (not shown) across the contacts 32 and 34 with the matrix 20 maintained at its desired operating temperature, then $R_{sq} = R_m/10$, since the length of the doped region 36 is 10w. The resistance of each unit section having dimensions w×w of the doped region 36 and doped sections 28 is $0.1 \times R_m$. It will be assumed for purposes of description that the resistance of the contacts 24, 26, 32, and 34 is zero. It will be noted that the sheet resistance $R_{sq}$ of the sections 28 may be determined by means other than measuring the sheet resistance of the probe resistor 30, such as by using a four point probe measurement or electron beam probe of either the doped region 36 or one of the sections 28.

Assuming that $R_d$ is the desired design resistance of the doped region 36 of the probe resistor 30, the ratio k $=R_m/R_d$ is computed to determined whether the sections 28 should be connected in series or parallel (the measured resistance $R_m$ is lower or higher than the design or reference value $R_d$ respectively). If $k<1$ ($R_m<R_d$) and is an exact integer, a number of sections 28 equal to k are interconnected in series. If $k>1$ ($R_m>R_d$) and is an exact integer, a number of sections equal to k are interconnected in parallel. For non-integer values of k, at least some of the sections 28 may be interconnected in accordance with the following algorithm.

First, an integer variable n is computed. For $k>1$, n is equal to k rounded off to the next lowest integer. (e.g. if k=9.5, then n=9). For $k<1$, n is equal to 1/k rounded off to the next lowest integer (e.g. if k=0.117, then 1/k=8.5 and n=8).

The algorithm includes three cases depending on the values of k and n.

Case 1: $k<1$, n is even (illustrated in FIG. 3)

Use a FIB to implant a doped section which constitutes a plug 40 to electrically connect the left end of the upper section 28 to the first contact 24. Implant a plug 42 to connect the right end of the n+1th section 28 to the second contact 26. Implant plugs 44 to interconnect the ends of the sections 28 from the first section to the nth section in a serpentine manner as illustrated, such that the sections 28 are connected in series with each other. Finally, implant a plug 46 to interconnect the nth section 28 with the n+1th section 28 at intermediate positions thereof.

The lateral displacement x of the left end of the plug 46 from the right end of the nth section 28 is computed as follows.

$x=10fw$, where $f=0.5[(1/k)-(0.9(n-1))-0.3]$

Figure 3:
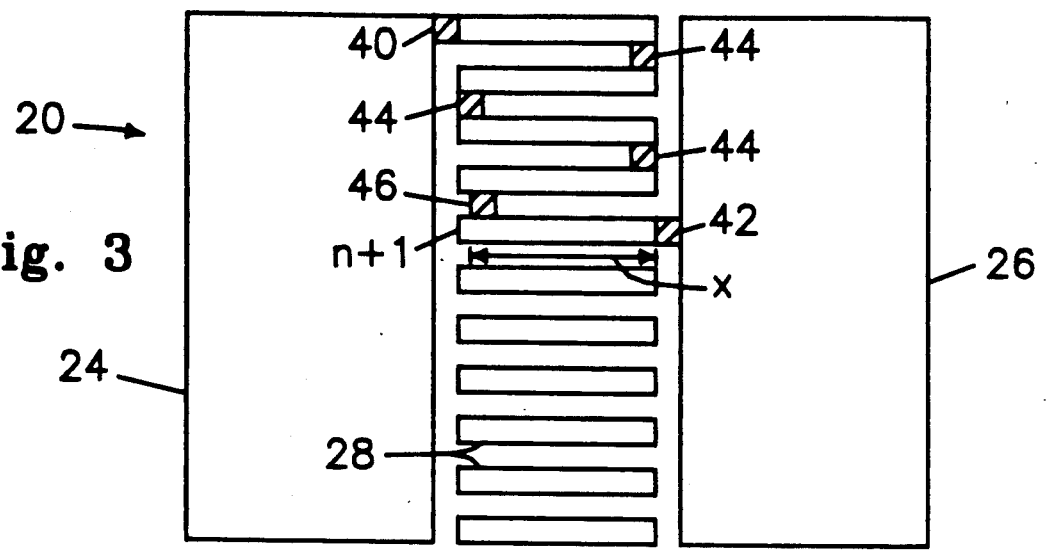
FIGS. 3, 4, and 5 are diagrams illustrating how the matrix of FIG. 2 is programmed by forming electrically interconnecting plugs using a focused ion beam for three different configurations respectively.

In the exemplary case illustrated in FIG. 3, $R_d=1M\Omega$, $R_m=0.222M\Omega$, k=0.222, 1/k=4.5, n=4, f=0.75, x=7.5w. The proposed matrix resistor will have a resistance $R_p$, where $R_p=45 \times R_{sq} = 4.5 (10 \times R_{sq})=4.5 R_m=R_d$.

Case 2: $k<1$, n is odd (illustrated in FIG. 4)

Use a FIB to implant the plug 40 to electrically connect the left end of the upper section 28 to the first contact 24. Implant the plug 42 to connect the right end of the n+2th section 28 to the second contact 26. Implant the plugs 44 to interconnect the ends of the sections 28 from the first section to the n+1th section in a serpentine manner as illustrated, such that the sections 28 are connected in series with each other. Finally, implant the plug 46 to interconnect the n+1the section 28 with the n+2th section 28 at intermediate positions thereof.

The lateral displacement x of the left end of the plug 46 from the right end of the n+1th section 28 is computed as follows.

$x=10fw$, where $f=0.5[(1/k)-0.9n-0.3]$

Figure 4:
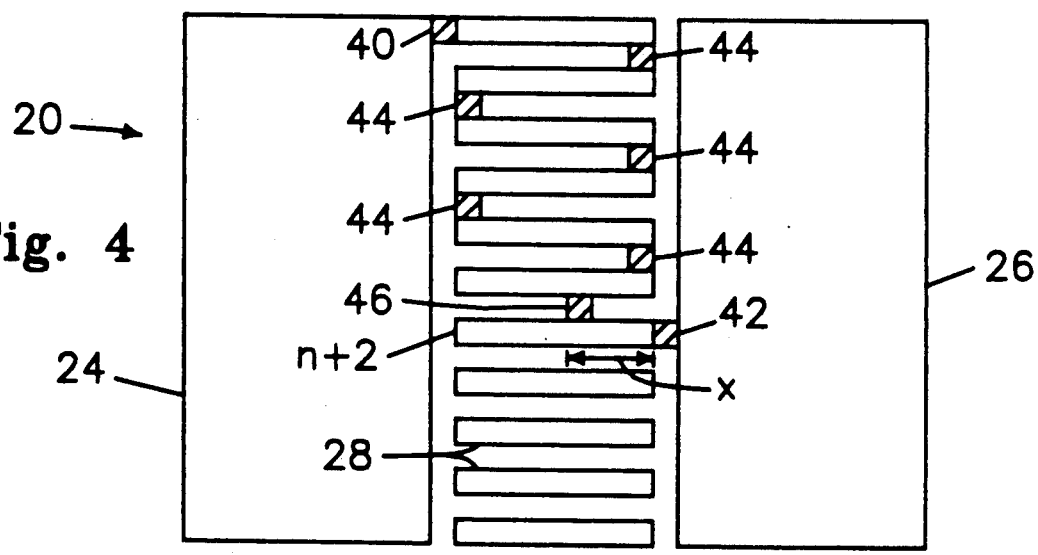

In the exemplary case illustrated in FIG. 4, $R_d=1M\Omega$, $R_m=0.182M\Omega$, k=0.182, 1/k=5.5, n=5, f=0.35, x=3.5w. The proposed matrix resistor will then have a resistance $R_p$, where $R_p=55 \times R_{sq}=5.5 (10 \times R_{sq})=5.5 R_m=R_d$.

Case 3: $k>1$ (illustrated in FIG. 5)

Use a FIB to implant the plug 40 to electrically connect the left end of the upper section 28 to the first contact 24. Implant the plug 42 to connect the right end of the n+1th section 28 to the second contact 26. Implant the plugs 44 to connect the left and right ends of the sections 28 from the first section to the nth section 28 to the adjacent contacts 24 and 26 such that the sections 28 are connected in parallel with each other. Finally, implant the plug 46 to interconnect the nth section 28 with the n+1th section 28 at intermediate positions thereon.

The lateral displacement x of the left end of the plug 46 from the right edge of the contact 24 is computed as follows.

x = 10fw, where f = [(n+1)−k]/[(1−n)+k]

Figure 5:
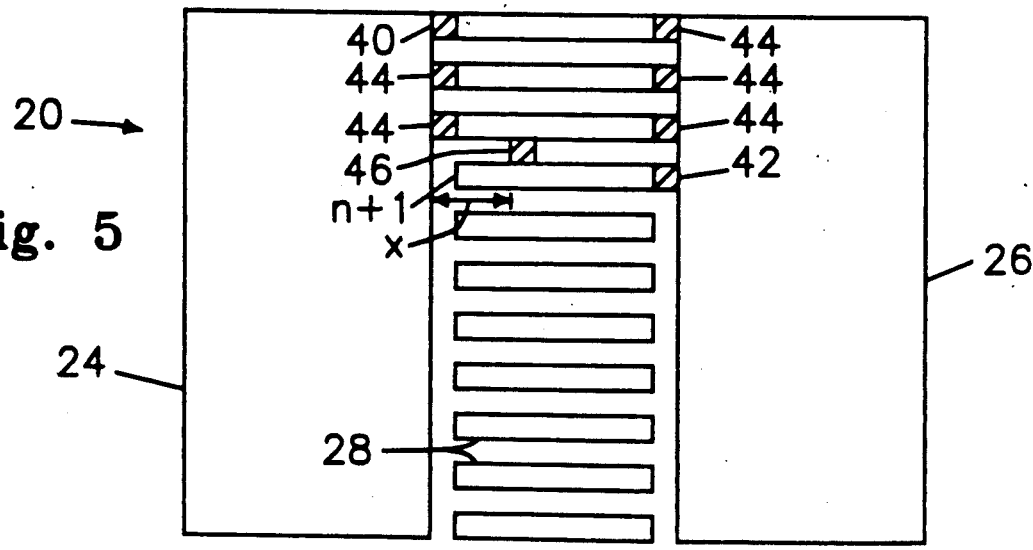

In the exemplary case illustrated in FIG. 5, $R_d = 1M\Omega$, $R_m = 3.5M\Omega$, k = 3.5, k = 3.5, n = 3, f = 0.33, x = 3.3w. The programmed matrix resistor will have a resistance $R_p$, where $R_p^{-1} = R_m^{-1} + R_m^{-1} + [0.33R_m + ((0.66R_m)^2)/(0.66R_m + 0.66R_m)]^{-1}$, $R_p = R_m/3.5 = R_d$.

In each case, the resistor is programmed such that the resistance value thereof, $R_p$ is equal to the desired design value, regardless of the actual sheet resistance of the sections 28. Preferably, the plugs 40, 42, 44, and 46 formed by implantation with the FIB have the same doping concentration and sheet resistance as the sections 28. However, the invention may be practiced with different concentrations and sheet resistances by making an appropriate revision to the algorithm. Although the programmable resistor matrix is specifically designed to be programmed using plugs formed with a FIB, it is possible to form the plugs by other means such as optical or electron beam lithography combined with diffusion, deposition, or masked flood implantation once the resistivity of the unconnected sections has been measured and the sections to be interconnected have been determined.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications can be made without departing from the spirit and scope of the invention as defined by the appended claims.

We claim:

1. An integrated circuit resistor, comprising:
a substrate; and
a doped region formed in and having a lower electrical sheet resistance than the substrate, the doped region having a boustrophedonic shape and including at least one section formed by implantation with a focused ion beam, said at least one section including substantially the entire doped region, the length of the doped region being substantially between 10 and 100 times the width of the boustrophedonic shape thereof.

2. A resistor as in claim 1, further comprising two ohmic contacts formed in the substrate in electrical connection with respective ends of the doped region.

3. A resistor as in claim 1, in which:
the doped region includes a plurality of unconnected sections; and
said at least one section formed by implantation with a focused ion beam includes at least one plug which electrically interconnects selected ones of said plurality of unconnected sections.

4. A resistor as in claim 5, in which said plurality of unconnected sections extend parallel to each other.

5. A resistor as in claim 6, further comprising first and second ohmic contacts formed in the substrate adjacent to opposite ends of said plurality of unconnected sections respectively; said at least one plug including a first plug which electrically interconnects the first ohmic contact to an end of one of the unconnected sections which is adjacent thereto; and a second plug which electrically interconnects the second ohmic contact to an end of one of the unconnected sections which is adjacent thereto.

6. A resistor as in claim 3, in which said at least one plug has substantially the same sheet resistance as the plurality of unconnected sections.

7. A resistor as in claim 3, in which said at least one plug has substantially the same doping concentration as the plurality of unconnected sections.

8. A resistor as in claim 7, in which the substrate is formed of silicon, and the doped region is formed by doping with a material selected from the group consisting of boron and arsenic with a dose between approximately $5 \times 10^{13}$ to $10 \times 10^{13}$ ions/cm$^2$.

9. A resistor as in claim 3, in which the unconnected sections are formed by means other than implantation with a focused ion beam.

10. A resistor as in claim 3, in which said at least one plug electrically interconnects some of said selected ones of said plurality of unconnected sections in series with each other.

11. A resistor as in claim 3, in which said at least one plug electrically interconnects some of said selected ones of said plurality of unconnected sections in parallel with each other.

12. A programmable resistor matrix, comprising:
a substrate;
a pair of spaced ohmic contact pads on the substrate; and
a plurality of unconnected, doped resistance sections formed in and having a lower electrical sheet resistance than the substrate, said resistance sections extending between and their opposite ends terminating near, but not contacting, said contact pads.

13. A matrix as in claim 12, in which said plurality of resistance sections extend parallel to each other.

14. A matrix as in claim 12, further comprising at least one plug having a lower electrical sheet resistance than the substrate, and electrically interconnecting selected ones of said plurality of resistance sections.

15. A matrix as in claim 14, in which said at least one plug includes a first plug which electrically connects the first ohmic contact pad to an end of one of the resistance sections which is adjacent thereto; and a second plug which electrically connects the second ohmic contact pad to an end of one of the resistance sections which is adjacent thereto.

16. A matrix as in claim 14, in which said at least one plug has substantially the same sheet resistance as the plurality of resistance sections.

17. A matrix as in claim 14, in which said at least one plug has substantially the same doping concentration as the plurality of resistance sections.

18. A matrix as in claim 17, in which the substrate is formed of silicon, and the resistance sections and said at least one plug are formed by doping with a material selected from the group consisting of boron and arsenic to a concentration between approximately $5 \times 10^{13}$ to $10 \times 10^{13}$ ions/cm$^2$.

19. A matrix as in claim 17, in which said at least one plug electrically interconnects some of said selected ones of said plurality of resistance sections in series with each other.

20. A matrix as in claim 17, in which said at least one plug electrically interconnects some of said selected ones of said plurality of resistance sections in parallel with each other.

* * * * *